US011522509B2

(12) United States Patent
Zhao et al.

(10) Patent No.: US 11,522,509 B2
(45) Date of Patent: Dec. 6, 2022

(54) FREQUENCY-SELECTIVE COMMON-MODE CONTROL AND OUTPUT STAGE BIASING IN AN OPERATIONAL AMPLIFIER FOR A CLASS-D AMPLIFIER LOOP FILTER

(71) Applicant: CIRRUS LOGIC INTERNATIONAL SEMICONDUCTOR LTD., Edinburgh (GB)

(72) Inventors: Xin Zhao, Austin, TX (US); Tejasvi Das, Austin, TX (US); Xiaofan Fei, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/194,395

(22) Filed: Mar. 8, 2021

(65) Prior Publication Data

US 2022/0286098 A1    Sep. 8, 2022

(51) Int. Cl.
   *H03F 3/45*    (2006.01)
(52) U.S. Cl.
   CPC ... *H03F 3/45076* (2013.01); *H03F 2200/129* (2013.01); *H03F 2203/45116* (2013.01); *H03F 2203/45512* (2013.01)
(58) Field of Classification Search
   CPC ........... H03F 3/45076; H03F 2200/129; H03F 2203/45116; H03F 2203/45512; H03F 1/02; H03F 1/0205; H03F 1/0211; H03F 1/26; H03F 1/30; H03F 1/301; H03F 1/32; H03F 1/3211; H03F 1/34; H03F 3/217;

(Continued)

(56) References Cited

U.S. PATENT DOCUMENTS

| 3,761,831 A | 9/1973 | Foerster |
| 4,555,673 A | 11/1985 | Huijsing et al. |

(Continued)

FOREIGN PATENT DOCUMENTS

| EP | 1096671 A1 | 4/2009 |
| EP | 2466745 A1 | 6/2012 |
| WO | WO2020/232620 | 11/2020 |

OTHER PUBLICATIONS

Lopez-Martin, et al., "Power-efficient class AB CMOS Buffer", Electronics Letters, Jan. 15, 2009.

(Continued)

*Primary Examiner* — John W Poos
*Assistant Examiner* — Tyler J Pereny
(74) *Attorney, Agent, or Firm* — Andrew M. Harris; Mitch Harris, Atty at Law, LLC (57) ABSTRACT

An operational amplifier with one or more fully-differential amplifier stages has a common-mode control input. A low-frequency feedback control path is coupled between an output of the fully-differential amplifier stages and the common-mode control input to control low-frequency drift of the common-mode voltage of the output of the stages. A high-frequency feed-forward control path couples a pair of inputs of the stages to control high-frequency ripple of a common-mode voltage of the inputs of the stages. One or more of the differential amplifier stages may have a bias input that controls a direct-current (DC) bias voltage of gates of pull-up transistors of the stage that is both DC and capacitively coupled to the gates so that the stage operates with class A bias at DC and with class AB bias at high frequencies.

21 Claims, 5 Drawing Sheets

(58) Field of Classification Search
CPC .... H03F 3/2173; H03F 3/2171; H03F 3/2175; H03F 3/211; H03F 3/187; H03F 3/45475; H03F 3/45183; H03F 3/45179; H03F 3/68; H03F 2200/03; H03F 2200/411; H03F 2200/372; H03F 2203/45528
See application file for complete search history.

(56) References Cited

U.S. PATENT DOCUMENTS

| | | | |
|---|---|---|---|
| 4,933,644 A | 6/1990 | Fattaruso et al. | |
| 5,613,233 A | 3/1997 | Vagher | |
| 6,590,436 B2 | 7/2003 | Jordanger et al. | |
| 6,603,356 B1 | 8/2003 | Kim et al. | |
| 6,774,722 B2 | 8/2004 | Hogervost | |
| 6,985,021 B1 | 1/2006 | Zaliznyak et al. | |
| 7,009,541 B1 | 8/2006 | Nguyen | |
| 7,233,203 B2 | 6/2007 | Huang | |
| 7,365,600 B1 | 4/2008 | Lokere | |
| 7,378,875 B2 | 5/2008 | Lee et al. | |
| 7,463,089 B1 | 12/2008 | Bapat et al. | |
| 7,705,671 B1 | 4/2010 | Bapat | |
| 7,724,043 B1 | 5/2010 | LeBouef, II et al. | |
| 7,843,263 B2 | 11/2010 | Wu et al. | |
| 7,893,766 B1 | 3/2011 | Cranford, Jr. et al. | |
| 8,242,842 B2 | 8/2012 | Lin et al. | |
| 8,552,801 B2 | 10/2013 | Myles | |
| 8,884,699 B2 | 11/2014 | Casiraghi et al. | |
| 9,184,730 B2 | 11/2015 | Wang et al. | |
| 9,203,364 B2 * | 12/2015 | Abe | H03F 3/45973 |
| 9,264,002 B2 | 2/2016 | Ni et al. | |
| 9,479,120 B2 | 10/2016 | Cho et al. | |
| 9,930,452 B2 | 3/2018 | Risbo et al. | |
| 10,320,337 B2 | 6/2019 | Zhao et al. | |
| 2009/0251216 A1 * | 10/2009 | Giotta | H03F 3/45928 330/258 |
| 2012/0154048 A1 * | 6/2012 | Myles | H03F 3/45704 330/260 |
| 2015/0256138 A1 * | 9/2015 | Dasgupta | H03F 3/45632 330/255 |

OTHER PUBLICATIONS

Perez-Bailon, et al., "A Fully Differential Variable Gain Amplifier for Portable Impedance Sensing Applications", Jomades de Jovenes Investigadores del 13A, Jun. 6, 2019.

Renteria-Pinon, et al., "Simple Scheme for the Implementation of Low Voltage Fully Differential Amplifiers without Output Common-Mode Feedback Network", Journal of Low Power Electronics and Applications, Oct. 23, 2020.

* cited by examiner

FREQUENCY-SELECTIVE COMMON-MODE CONTROL AND OUTPUT STAGE BIASING IN AN OPERATIONAL AMPLIFIER FOR A CLASS-D AMPLIFIER LOOP FILTER

BACKGROUND

1. Field of Disclosure

The field of representative embodiments of this disclosure relates to pulse-width modulated (PWM) audio amplifier or haptic driver methods and circuits that reduce power consumption of the loop filter amplifier using frequency-selective common-mode control and output stage biasing.

2. Background

Audio amplifiers, and other amplifiers such as those for driving haptic feedback devices, often are included in battery-powered equipment and are often implemented as class-D amplifiers using pulse-width modulation (PWM), constant-edge modulation or pulse-density modulation, due to their ability to deliver higher power output levels at lower voltages available in a battery-operated domain. Reduction of energy consumption in such circuits is very desirable, and particularly reduction of energy consumption in a quiescent operating state, in which the primary power driver may be the analog circuitry that provides the input to the modulator.

The loop filter of the class-D amplifier is typically implemented using multiple operational amplifiers implementing one or more integrator stages. Due to the requirements for low-noise performance in application such as audio amplifiers, the current consumed by the operational amplifier in at least the first stage of the loop filter is generally significantly large with respect to the overall energy budget, due to the need for operational amplifiers with low input-referred noise. Compounding the problem is the dynamic range consumed by the common-mode ripple of the input to the pulse-width modulator and the common-mode drift of the output of the modulator that is provided as a feedback signal. In order to provide the required dynamic range, the power supply voltage provided to the operational amplifiers must be increased, and due to the higher current needed by the operational amplifier power supply to provide low-noise operation, the energy consumed by the operational amplifiers is increased.

Therefore, it would be advantageous to provide operational amplifiers for the loop filter of a class-D amplifier that have lower energy consumption requirements.

SUMMARY

Reduced class-D amplifier energy consumption is accomplished in operational amplifier circuits, integrated circuits including class-D amplifiers having the operational amplifiers and their methods of operation.

In some embodiments, the operational amplifier provides a differential amplifier with one or more fully-differential amplifier stages, at least one of which has a common-mode control input. A low-frequency feedback control path is coupled between an output of the fully-differential amplifier stages and the common-mode control input, so that the low-frequency feedback path controls low-frequency drift of the common-mode voltage of the output of the fully-differential amplifier stages. A high-frequency feed-forward path is coupled between a pair of inputs of the one or more fully-differential amplifier stages, so that the high-frequency path controls high-frequency ripple of a common-mode voltage of a pair of inputs of the one or more fully-differential amplifier stages.

In some embodiments, the operational amplifier includes an output stage with a first pull-up transistor that couples a first output of the fully-differential amplifier to a positive supply voltage, a first pull-down transistor that couples the first output of the fully-differential amplifier to a negative supply voltage, a second pull-up transistor that couples a second output of the fully-differential amplifier to the positive supply voltage, a second pull-down transistor that couples the second output of the fully-differential amplifier to the negative supply voltage, a first capacitor that couples a gate of the first pull-down transistor and a gate of the first pull-up transistor, a second capacitor that couples a gate of the second pull-down transistor and a gate of the second pull-up transistor, and a bias input for controlling a direct-current (DC) bias voltage of the gate of the first pull-up transistor and the gate of the second pull-up transistor, so that the first output and the second output of the fully-differential amplifier stage operate with class A bias at DC and with class AB bias at high frequencies. The bias input is coupled to the gate of the first pull-up transistor by a first resistor and the gate of the second pull-up transistor by a second resistor. A first time constant of the first resistor and the first capacitor and a second time constant of the second resistor and the second capacitor are equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses circuits and integrated circuits that include improved Class-D amplifier circuits and their method of operation, and in particular, fully-differential operational amplifiers for use in the loop filter of a Class-D amplifier that have reduced power consumption. U.S. Pat. No. 10,320,337 entitled "FULLY-DIFFERENTIAL OPERATIONAL AMPLIFIER SYSTEM" discloses a class-D amplifier loop filter implemented with operational amplifiers having a dynamic common-mode control based on the operational amplifier input signals that transfers the input common-mode voltage of the operational amplifier to the outputs of the operational amplifier. Since the loop filter receives feedback from the outputs of the class-D amplifier, the power supply voltage of the operational amplifiers must be increased to accommodate both the input common-mode and the output common-mode peak variation, resulting in higher power consumption or reduced noise performance, depending on the setting of the bias currents in at least the first stage of integration. The present disclosure reveals operational amplifiers in which the input common-mode high-frequency ripple and the output common-mode voltage are introduced to the common-mode control circuit of the operational amplifier of the first integrator stage, so that additional dynamic range is not consumed, allowing for lower energy consumption for a given noise performance level. Another feature of the operational amplifiers disclosed herein reduces power consumption of the output stages of the operational amplifiers by providing class AB bias control without additional headroom and/or complex circuitry to dynamically control the operating point of the output stages of the operational amplifiers.

Figure 1:
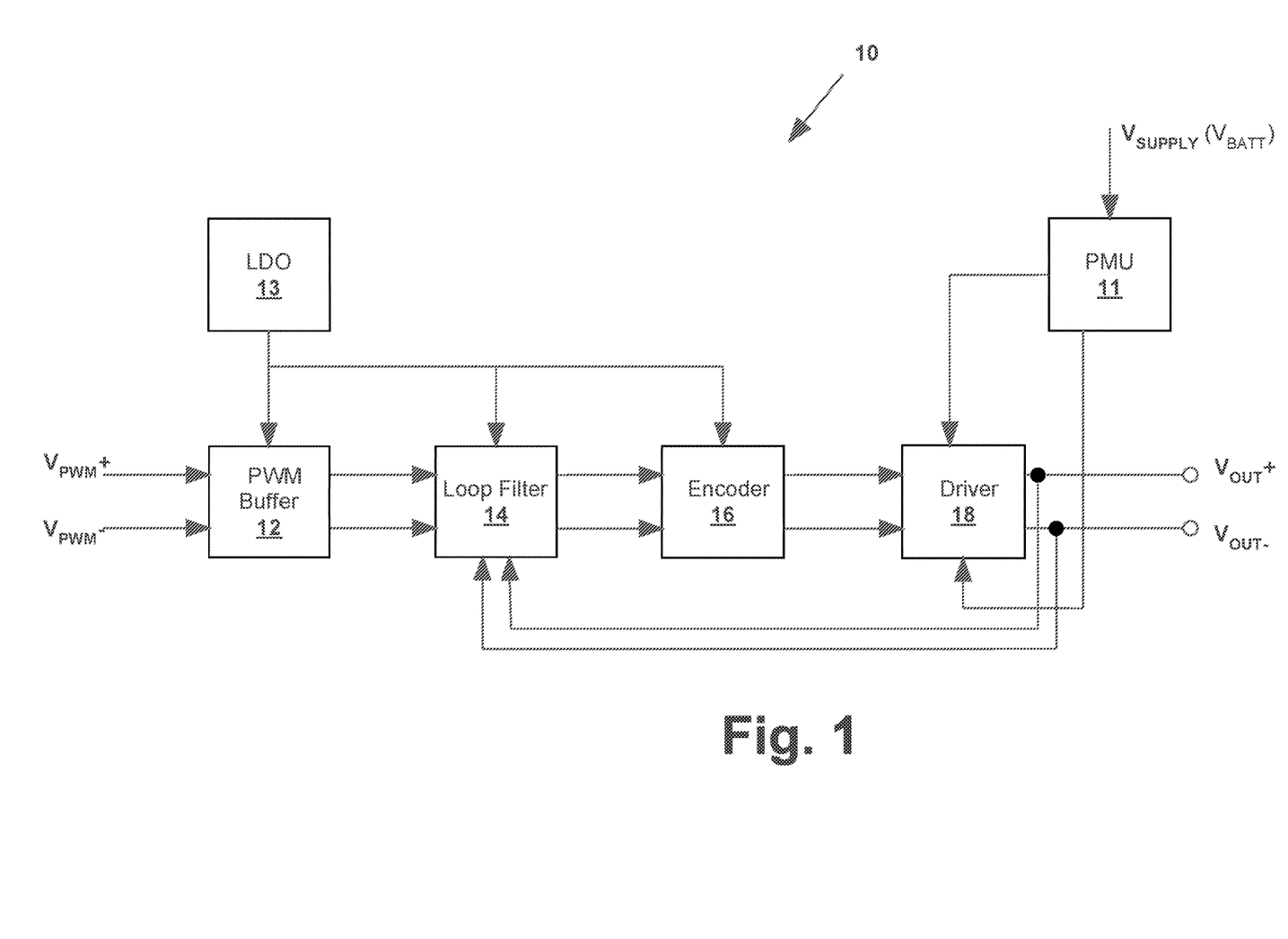
FIG. 1 is a block diagram showing an example class-D amplifier circuit 10, in accordance with an embodiment of the disclosure.

Referring now to FIG. 1, an example class-D amplifier 10, in accordance with an embodiment of the disclosure is shown, in accordance with an embodiment of the disclosure. A low-dropout (LDO) regulator 13 provides a power supply voltage to an input circuit including a pulse-width modulation (PWM) buffer 12 which receives a differential pair of signals $V_{PWM+}$, $V_{PWM-}$. A loop filter 14 provides fully-differential operation throughout and generates an output that is quantized by an encoder 16, e.g., a quantizer, that provides a differential pair of switch control signals to the inputs of a driver 18 that generates the outputs $V_{OUT+}$ and $V_{OUT-}$, which may be, for example audio outputs or haptic driver outputs for driving voice-coil type transducers. A power management unit 11 controls power supplied from an input power supply $V_{SUPPLY}$ (which may be a battery voltage $V_{BATT}$).

Figure 2:
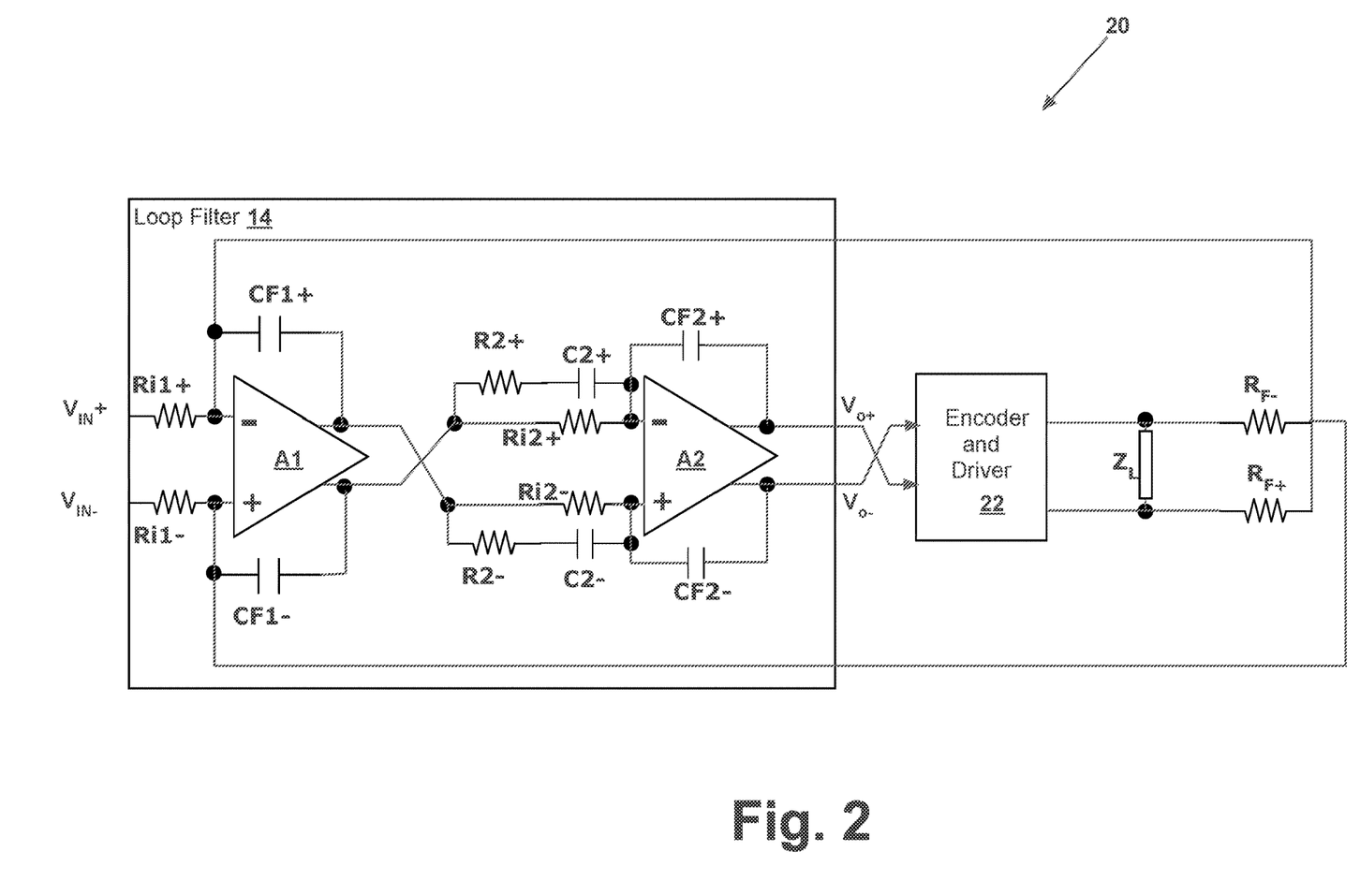
FIG. 2 is a simplified schematic diagram of an example loop filter 20 that may be used to implement loop filter 14 of FIG. 1, in accordance with an embodiment of the disclosure.
Figure 5A:
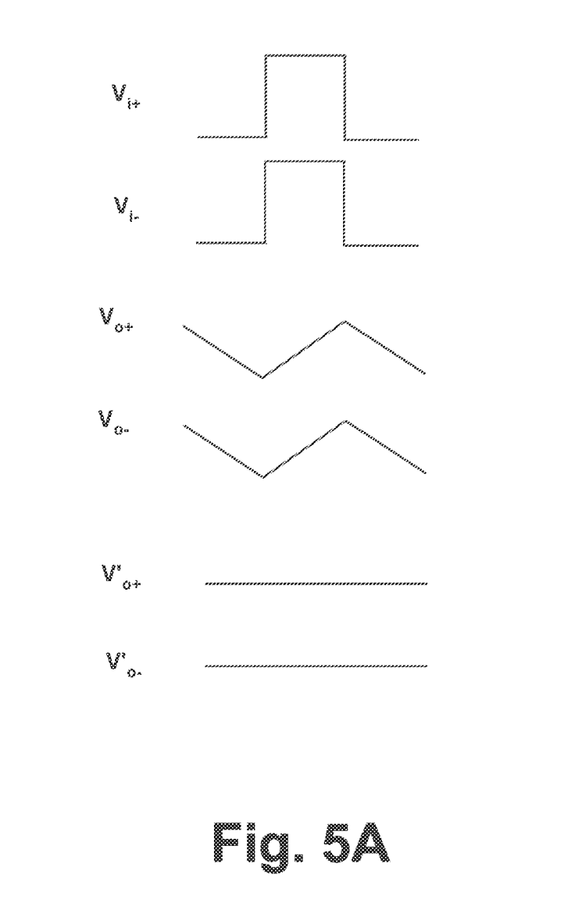
FIG. 5A is an example signal waveform diagram 50 illustrating operation of example fully-differential operational amplifier 30 of FIG. 3 in a class-D amplifier, in accordance with another embodiment of the disclosure.

Referring now to FIG. 2, a simplified schematic diagram of an example circuit including a loop filter 14 implementation that may be used to implement loop filter 14 of FIG. 1 is shown, in accordance with an embodiment of the disclosure. A differential pair of input signals $V_{IN+}$, $V_{IN-}$ are received by a first fully-differential operational amplifier A1 which forms an integrator stage with input resistors Ri1+, Ri1- and feedback capacitors CF1+, CF1-. The first integrator stage provides a differential output to a second integrator stage formed by a second fully-differential amplifier A2, feedback capacitors CF2+, CF2- and input resistors Ri2+, Ri2-. A zero is introduced by resistors R2+, R2- and corresponding capacitors C2+, C2- to cancel the integrator pole for stability above frequencies at which the integrator operates. While amplifiers A1 and A2 are shown as a pair of operational amplifiers, amplifiers A1 and A2 can represent a single operational amplifier with a differential input and a differential output stage as will be described below, or additional differential amplifier and/or operational amplifier stages may be provided between the input stage and the output stage without loss of generality with respect to the techniques disclosed herein. The output of loop filter 14 is provided by an encoder and driver that quantizes and encodes the output of loop filter 14 and provides higher-current drive signals to a load $Z_L$. A pair of feedback resistors $R_{F+}$, $R_{F-}$, provide feedback to close a differential control feedback loop around loop filter 14 and encoder driver stage 22. FIG. 5A shows the relationship between the differential input ripple present on input signals $V_{IN+}$, $V_{IN-}$ and the resulting output signals $V_{o+}$,$V_{o-}$, of fully-differential amplifier A2 compared to output signals $V'_{o+}$,$V'_{o-}$ of a typical fully-differential integrator stage.

Figure 3:
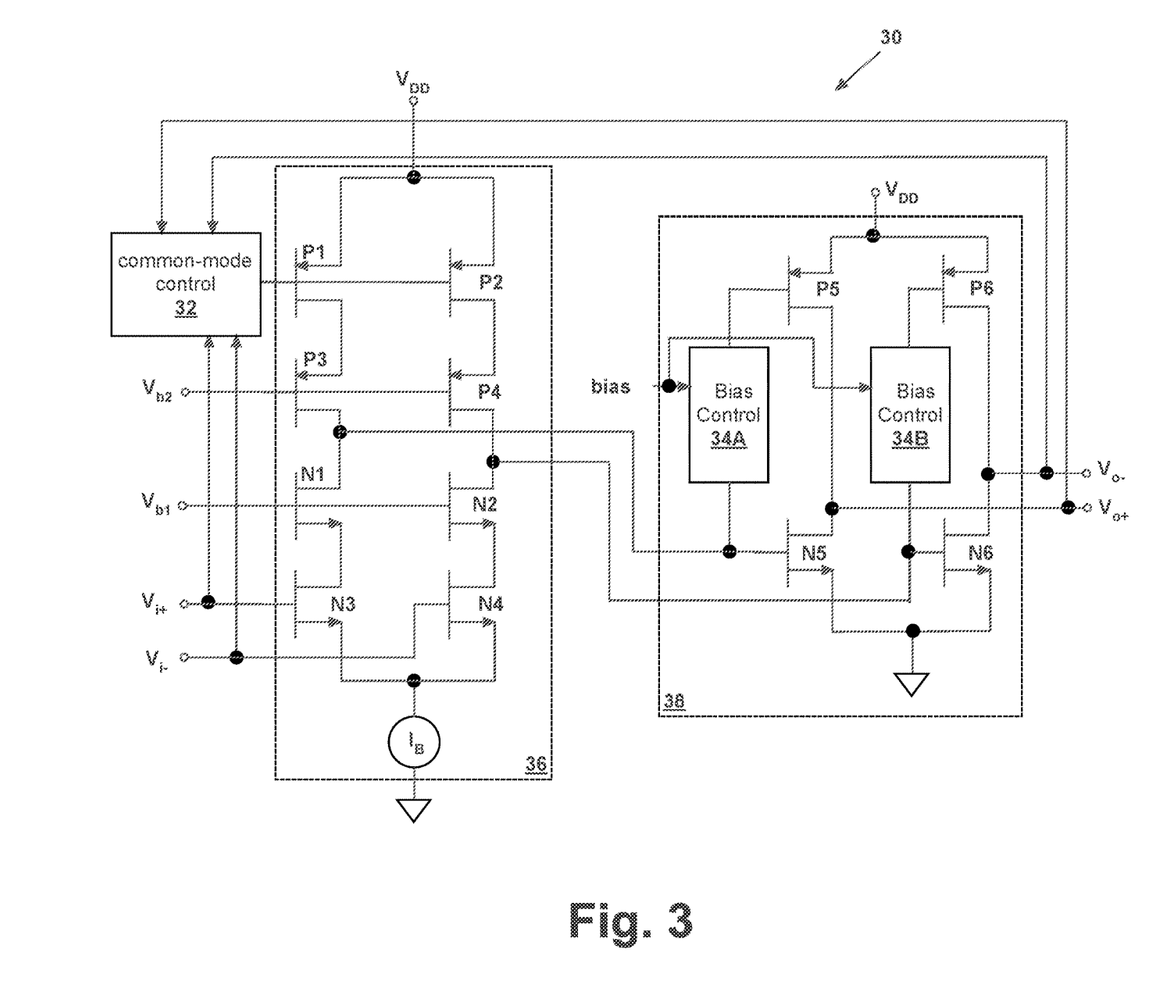
FIG. 3 is a simplified schematic diagram showing an example fully-differential operational amplifier 30 that can be used to implement amplifiers A1 and A2 of loop filter 14 of FIG. 2.

Referring now to FIG. 3, a simplified schematic diagram showing an example fully-differential operational amplifier 30 that can be used to implement amplifiers A1 and A2 of loop filter 14 of FIG. 2 is shown, in accordance with an embodiment of the disclosure. An input stage 36 of fully-differential operational amplifier 30 is a telescopic differential amplifier stage implemented by transistors P1-P4 and transistors N1-N4, with a quiescent point operating current set by a current source $I_B$. A common-mode control block 32 sets the voltage drop across transistors P1 and P2 and is provided with inputs from both inputs $V_{i+}$, $V_{i-}$ and outputs $V_{o+}$,$V_{o-}$ of fully-differential operational amplifier 30, in contrast to typical feedback-type common-mode control, which is controlled only by the output signals of an operational amplifier, or feed-forward type control, such as that disclosed in above-referenced U.S. Pat. No. 10,320,337, in which control is provided only from the input signals. Common-mode control block 32 acts to vary the voltage drop across the gates of transistors P1 and P2 to vary the common-mode voltage of a pair of output signals $V_{o-}$, $V_{o+}$ provided by a differential amplifier formed by transistors N3 and N4 of input stage 36, and thereby control the common-mode voltage of output signals $V_{o+}$,$V_{o-}$, according to the feedback provided to common-mode control block 32. Other bias voltages $V_{b1}$, $V_{b2}$ set the quiescent operating point of input stage 36. Input voltages $V_{i+}$,$V_{i-}$ represent the summing node voltages of fully-differential operational amplifier 30. Common-mode control block 32 includes separate high-frequency and low-frequency signal paths, in accordance with an embodiment of the disclosure, so that rather than reacting to the input common-mode ripple present on input signals $V_{IN+}$, $V_{IN-}$ of FIG. 2 as would be typical for a feedback loop that passes high and low frequency components of the steady-state output of driver 18 in FIG. 1, common-mode control block 32 causes the high-frequency input common-mode ripple and the low frequency drift of the output common-mode voltage to be suppressed or eliminated at the output of input stage 36 directly by action of the bias point controlled by transistors P1, P2. The above-described operation cancels high-frequency common-mode changes introduced at the inputs of the first differential amplifier formed by transistors N3 and N4, so that the power supply voltage can be reduced, since dynamic range of the differential amplifier formed by transistors N3 and N4 is not expended in cancelling the high-frequency common-mode signals at the summing nodes of fully-differential operational amplifier 30.

Input stage 36 provides a differential output to an output stage 38 of fully-differential amplifier 40 formed by push-pull transistor pairs P5, N5 and P6, N6, which generate differential output signals $V_{o+}, V_{o-}$. A pair of bias control circuits 34A, 34B provide a class-AB bias circuit that dynamically alters the bias point in response to the input signals provided to the gates of transistors N5 and N6. A bias control input bias sets the quiescent operating point of bias control circuits 34A, 34B, so that class-AB operation is activated when a substantial high-frequency signal swing is needed from output signals $V_{o+}, V_{o-}$, which reduces energy consumption in output stage 38 by preventing both of the transistors in each of push-pull transistor pairs P5, N5 and P6, N6 from being biased fully on. In addition, class-AB operation has the advantage of providing higher output current and larger transconductance. Bias control circuits 34A, 34B are frequency selective, so that the higher-frequency signals corresponding to the class-D amplifier switching frequency will only cause class-AB operation, while DC or low-frequency drift of the outputs of the class-D amplifier that should be reflected in output signals $V_{o+}, V_{o-}$ for proper feedback cancellation will be sufficiently reproduced.

Figure 4:
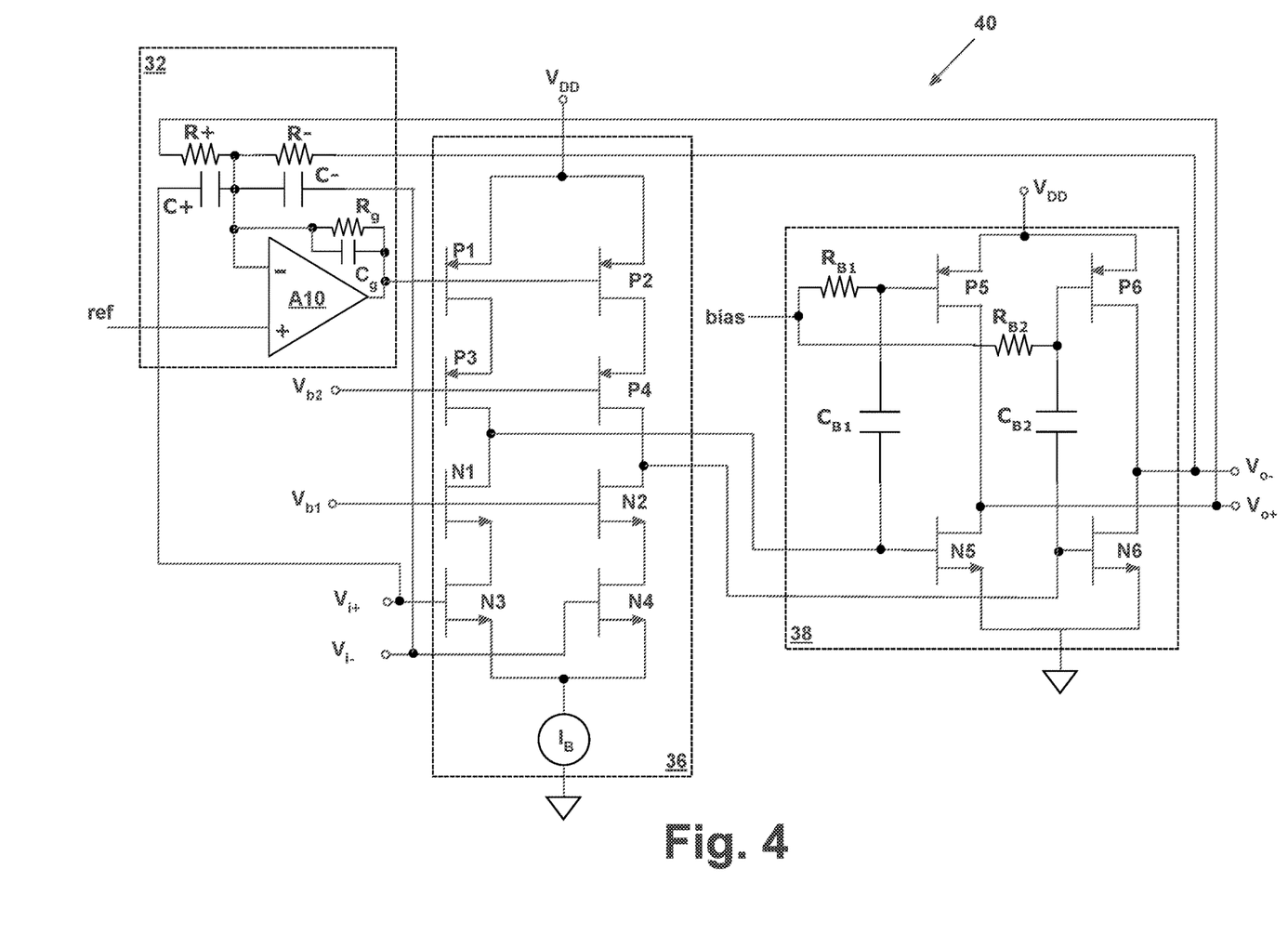
FIG. 4 is a schematic diagram showing details of an example fully-differential operational amplifier 40 that can be used to implement fully-differential operational amplifier 30 of FIG. 3, in accordance with another embodiment of the disclosure.

FIG. 4 is a schematic diagram showing further details of an example fully-differential operational amplifier 40 that can be used to implement fully-differential operational amplifier 30 of FIG. 3, in accordance with another embodiment of the disclosure. FIG. 4 shows further details of a particular example of fully-differential amplifier 30 as described above, so only differences between the example of FIG. 3 and the example of FIG. 4 are described below. Referring to FIG. 4, common-mode control block 32 is implemented with an operational amplifier A10 that has an output connected to the gates of transistors P1 and P2, which set the common-mode output voltage produced by telescopic input stage 36. Input voltages $V_{i+}, V_{i-}$ are coupled to the input of an operational amplifier A10 by capacitors C+ and C−, respectively, which provide an input common-mode high-frequency feed-forward path. Resistors R+, R− that provide operational amplifier A10 with feedback from output signals $V_{o+}, V_{o-}$ of output stage 38 provide a feedback common-mode low-frequency path provided. A gain-setting resistor $R_g$ sets the DC gain of common-mode control block 32 and a capacitor $C_g$ provides a pole in combination with gain-setting resistor $R_g$ to set an upper bound on the response of common-mode control block 32 to output signals $V_{o+}, V_{o-}$ and to set the gain of common-mode control block 32 with respect to the common-mode voltage of input voltages $V_{i+}, V_{i-}$.

Figure 5B:
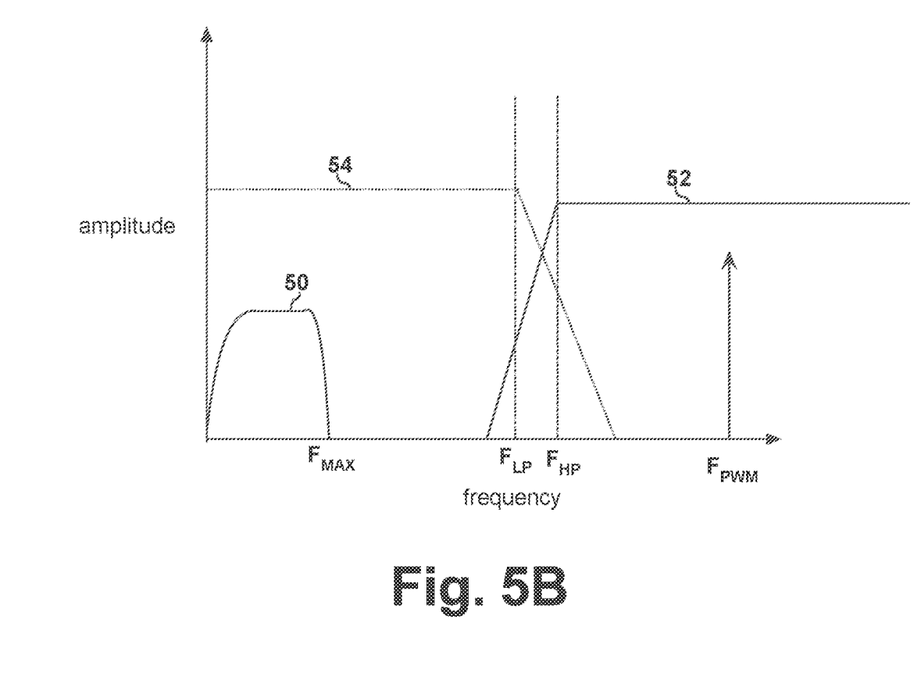
FIG. 5B is a graph showing frequency relationships between common-mode and bias control signal paths in fully-differential operational amplifier 30 of FIG. 3 in a class-D amplifier, in accordance with another embodiment of the disclosure.

Referring now to FIG. 5B, is a graph showing frequency relationships between common-mode and bias control signal paths in fully-differential operational amplifier 30 of FIG. 3 in a class-D amplifier is illustrated, in accordance with another embodiment of the disclosure. An audio bandwidth 50 of class-D amplifier 10 of FIG. 1, terminates at a frequency $F_{MAX}$, while a corner frequency $F_{HP}$ of the RC filter formed by resistor-capacitor (RC) networks $C_{B1}$, $R_{B1}$ and $C_{B2}$, $R_{B2}$ falls between $F_{MAX}$ and a switching frequency of the class-D amplifier $F_{PWM}$. The capacitance $C_{HP}$ of capacitors $C_{B1}$ and $C_{B2}$ is generally equal, as is the resistance $R_{HP}$ of resistors $R_{B1}$ and $R_{B2}$, which leads to an equal corner frequency $F_{HP} = 1/(2\pi R_{HP} C_{HP})$, but that condition is not a requirement of all of the embodiments of the disclosure. Similarly, a corner frequency $F_{LP}$ of the low-pass characteristic that removes high-frequency information from the feedback provided from the outputs $V_{o+}, V_{o-}$ of fully-differential operational amplifier 40 may be equal to corner frequency $F_{HP}$, or may differ, according to various embodiments of the disclosure. Corner frequency $F_{LP} = 1/(2\pi R_{LP} C_{LP})$ where $C_{LP}$ is the capacitance of capacitors C+, C− and $R_{LP}$ is the resistance of resistors R+, R−.

In summary, this disclosure shows and describes circuits and integrated circuits having Class-D amplifiers including operational amplifiers that provide reduced energy consumption, particularly operational amplifiers for implementing loop filters of the class-D amplifiers.

In some example embodiments, the operational amplifiers provide a differential amplifier that includes one or more fully-differential amplifier stages, in which at least one of the fully-differential amplifier stages has a common-mode control input, a low-frequency feedback control path coupled between an output of the fully-differential amplifier stages and the common-mode control input, and a high-frequency feed-forward control path coupled between a pair of inputs of the one or more fully-differential amplifier stages and the common-mode control input. The low-frequency feedback path may control low-frequency drift of the common-mode voltage of the output of the fully-differential amplifier stages, and the high-frequency feed-forward path may control high-frequency ripple of a common-mode voltage of the pair of inputs of the one or more fully-differential amplifier stages. The differential amplifier may be a plurality of fully-differential amplifier stages coupled in a cascade and at least one of the fully-differential amplifier stages that has the common-mode control input may be a first stage of the cascade. The plurality of fully-differential amplifier stages may be a pair of fully-differential stages, wherein the at least one of the fully-differential amplifier stages that has the common-mode control input may be a first stage of the cascade, and the last one of the fully-differential amplifier stages may be a second stage of the cascade. In some example embodiments, the operational amplifiers provide a fully-differential amplifier that implements an integrator for providing an output to a switched-power stage of a switched-power amplifier. The high-frequency feedback path may be bandlimited with a lower frequency bound above a signal frequency range reproduced by the switched-power amplifier in response to signals provided at an input of the integrator and below a switching frequency of the switched-power stage.

An operational amplifier, which may be a last stage of the above-mentioned cascade may comprise a first pull-up transistor that couples a first output of the fully-differential amplifier to a positive supply voltage, a first pull-down transistor that couples the first output of the fully-differential amplifier to a negative supply voltage, a second pull-up transistor that couples a second output of the fully-differential amplifier to the positive supply voltage, a second pull-down transistor that couples the second output of the fully-differential amplifier to the negative supply voltage, a first capacitor that couples a gate of the first pull-down transistor and a gate of the first pull-up transistor, a second capacitor that couples a gate of the second pull-down transistor and a gate of the second pull-up transistor, and a bias input for controlling a DC bias voltage of the gate of the first pull-up transistor and the gate of the second pull-up transistor, so that the first output and the second output of the fully-differential amplifier stage operates with class A bias at DC and with class AB bias at high frequencies. The bias input may be coupled to the gate of the first pull-up transistor by a first resistor and the gate of the second pull-up transistor by a second resistor, and a first time constant of the first resistor and the first capacitor and a second time constant of the second resistor and the second capacitor may be equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator. The switched-power amplifier may be an amplifier for providing a differential drive signal to an acoustic transducer having an acoustic transducer bandwidth above which the acoustic transducer has negligible response, and wherein the upper bound of the signal frequency range is an upper limit of the acoustic transfer bandwidth.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in an amplifier circuit that provides a linear output function in response to large input signal swing.

What is claimed is:

1. A differential amplifier, comprising:
   one or more fully-differential amplifier stages, wherein at least one of the fully-differential amplifier stages has a common-mode control input;
   a low-frequency feedback control path coupled between an output of the fully-differential amplifier stages and the common-mode control input, wherein the low-frequency feedback path controls low-frequency drift of a common-mode voltage of the output of the fully-differential amplifier stages; and
   a high-frequency feed-forward control path coupled between a pair of inputs of the one or more fully-differential amplifier stages and the common-mode control input, wherein the high-frequency path controls high-frequency ripple of a common-mode voltage of a pair of inputs of the one or more fully-differential amplifier stages.

2. The differential amplifier of claim 1, wherein the one or more fully-differential amplifier stages is a plurality of fully-differential amplifier stages coupled in a cascade.

3. The differential amplifier of claim 2, wherein the at least one of the fully-differential amplifier stages that has the common-mode control input is a first stage of the cascade.

4. The differential amplifier of claim 2, wherein a last one of the fully-differential amplifier stages comprises:
   a first pull-up transistor that couples a first output of the last one of the fully-differential amplifier stages to a positive supply voltage;
   a first pull-down transistor that couples the first output of the last one of the fully-differential amplifier to a negative supply voltage;
   a second pull-up transistor that couples a second output of the last one of the fully-differential amplifier to the positive supply voltage;
   a second pull-down transistor that couples the second output of the last one of the fully-differential amplifier to the negative supply voltage;
   a first capacitor that couples a gate of the first pull-down transistor and a gate of the first pull-up transistor;
   a second capacitor that couples a gate of the second pull-down transistor and a gate of the second pull-up transistor; and
   a bias input for controlling a direct-current (DC) bias voltage of the gate of the first pull-up transistor and the gate of the second pull-up transistor, whereby the first output and the second output of the last one of the fully-differential amplifier stages operates with class A bias at DC and with class AB bias at high frequencies.

5. The differential amplifier of claim 4, wherein the plurality of fully-differential amplifier stages is a pair of fully-differential stages, wherein the at least one of the fully-differential amplifier stages that has the common-mode control input is a first stage of the cascade, wherein the last one of the fully-differential amplifier stages is a second stage of the cascade.

6. The differential amplifier of claim 4, wherein the cascade of fully-differential amplifiers implements an integrator for providing an output to a switched-power stage of a switched-power amplifier, wherein the bias input is coupled to the gate of the first pull-up transistor by a first resistor and the gate of the second pull-up transistor by a second resistor, and wherein a first time constant of the first resistor and the first capacitor and a second time constant of the second resistor and the second capacitor are equal and fall between a switching frequency of the switched-power stage and an upper bound of a signal frequency range reproduced by the switched-power amplifier in response to signals provided at an input of the integrator.

7. The differential amplifier of claim 6, wherein the switched-power amplifier is an amplifier for providing a differential drive signal to an acoustic transducer having an acoustic transducer bandwidth above which the acoustic transducer has negligible response, and wherein the upper bound of the signal frequency range is an upper limit of the acoustic transfer bandwidth.

8. The differential amplifier of claim 2, wherein the cascade of fully-differential amplifiers implements an integrator for providing an output to a switched-power stage of a switched-power amplifier, wherein the high-frequency feedback path is bandlimited with a lower frequency bound above a signal frequency range reproduced by the switched-power amplifier in response to signals provided at an input of the integrator and below a switching frequency of the switched-power stage.

9. A fully-differential amplifier that implements an integrator for providing an output to a switched-power stage of a switched-power amplifier, the differential amplifier comprising:
   a first pull-up transistor that couples a first output of the fully-differential amplifier to a positive supply voltage;
   a first pull-down transistor that couples the first output of the fully-differential amplifier to a negative supply voltage;
   a second pull-up transistor that couples a second output of the fully-differential amplifier to the positive supply voltage;
   a second pull-down transistor that couples the second output of the fully-differential amplifier to the negative supply voltage;
   a first capacitor that couples a gate of the first pull-down transistor and a gate of the first pull-up transistor;
   a second capacitor that couples a gate of the second pull-down transistor and a gate of the second pull-up transistor; and
   a bias input for controlling a direct-current (DC) bias voltage of the gate of the first pull-up transistor and the gate of the second pull-up transistor, whereby the first output and the second output of the fully-differential amplifier stage operates with class A bias at DC and with class AB bias at high frequencies, wherein the bias input is coupled to the gate of the first pull-up transistor by a first resistor and the gate of the second pull-up transistor by a second resistor, and wherein a first time constant of the first resistor and the first capacitor and a second time constant of the second resistor and the second capacitor are equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator.

10. The fully-differential amplifier of claim 9, wherein the switched-power amplifier is an amplifier for providing a differential drive signal to an acoustic transducer having an acoustic transducer bandwidth above which the acoustic transducer has negligible response, and wherein the upper bound of the signal frequency range is an upper limit of the acoustic transfer bandwidth.

11. A method of controlling an output common-mode voltage and an input common-mode voltage of an integrator providing an output to a switched-power stage of a switched-power amplifier, the method comprising:
providing one or more fully-differential amplifier stages with a common-mode control input;
controlling low-frequency drift of a common-mode voltage of the output of the fully-differential amplifier stages with a low-frequency feedback control path coupled between an output of the fully-differential amplifier stages and the common-mode control input; and
controlling high-frequency ripple of a common-mode voltage of a pair of inputs of the one or more fully-differential amplifier stages with a high-frequency feed-forward path coupled between the pair of inputs of the one or more fully-differential amplifier stages and the common-mode control input.

12. The method of claim 11, wherein the providing one or more fully-differential amplifier stages provides a plurality of fully-differential amplifier stages coupled in a cascade.

13. The method of claim 12, wherein the at least one of the fully-differential amplifier stages that has the common-mode control input is a first stage of the cascade.

14. The method of claim 12, further comprising:
coupling a first output of a last one of the fully-differential amplifier stages to a positive supply voltage with a first pull-up transistor;
coupling the first output of the last one of the fully-differential amplifier stages to a negative supply voltage with a first pull-down transistor;
coupling a second output of the last one of the fully-differential amplifier stages to the positive supply voltage with a second pull-up transistor;
coupling the second output of the last one of the fully-differential amplifier stages to the negative supply voltage with a second pull-down transistor;
coupling a gate of the first pull-down transistor and a gate of the first pull-up transistor with a first capacitor;
coupling a gate of the second pull-down transistor and a gate of the second pull-up transistor with a second capacitor; and
controlling a direct-current (DC) bias voltage of the gate of the first pull-up transistor and the gate of the second pull-up transistor in response to a bias input that is coupled to the gate of the first pull-up transistor by a first resistor and the gate of the second pull-up transistor by a second resistor, whereby the first output and the second output of the last one of the fully-differential amplifier stages operates with class A bias at DC and with class AB bias at high frequencies, and wherein a first time constant of the first resistor and the first capacitor and a second time constant of the second resistor and the second capacitor are equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator.

15. The method of claim 14, wherein the plurality of fully-differential amplifier stages is a pair of fully-differential stages, wherein the at least one of the fully-differential amplifier stages that has the common-mode control input is a first stage of the cascade, wherein the last one of the fully-differential amplifier stages is a second stage of the cascade.

16. The method of claim 14, wherein the cascade of fully-differential amplifiers implements an integrator for providing an output to a switched-power stage of a switched-power amplifier, wherein the bias input is coupled to the gate of the first pull-up transistor by a first resistor and the gate of the second pull-up transistor by a second resistor, and wherein a first time constant of the first resistor and the first capacitor and a second time constant of the second resistor and the second capacitor are equal and fall between a switching frequency of the switched-power stage and an upper bound of a signal frequency range reproduced by the switched-power amplifier in response to signals provided at an input of the integrator.

17. The method of claim 16, wherein the switched-power amplifier is an amplifier for providing a differential drive signal to an acoustic transducer having an acoustic transducer bandwidth above which the acoustic transducer has negligible response, and wherein the upper bound of the signal frequency range is an upper limit of the acoustic transfer bandwidth.

18. The method of claim 12, wherein the cascade of fully-differential amplifiers implements an integrator for providing an output to a switched-power stage of a switched-power amplifier, wherein the high-frequency feedback path is bandlimited with a lower frequency bound above a signal frequency range reproduced by the switched-power amplifier in response to signals provided at an input of the integrator and below a switching frequency of the switched-power stage.

19. A method of conserving energy in a differential amplifier that implements an integrator for providing an output to a switched-power stage of a switched-power amplifier, the method comprising:
coupling a first output of the fully-differential amplifier to a positive supply voltage with a first pull-up transistor;
coupling the first output of the fully-differential amplifier to a negative supply voltage with a first pull-down transistor;
coupling a second output of the fully-differential amplifier to the positive supply voltage with a second pull-up transistor;
coupling the second output of the fully-differential amplifier to the negative supply voltage with a second pull-down transistor;
coupling a gate of the first pull-down transistor and a gate of the first pull-up transistor with a first capacitor;
coupling a gate of the second pull-down transistor and a gate of the second pull-up transistor with a second capacitor; and controlling a direct-current (DC) bias voltage of the gate of the first pull-up transistor and the gate of the second pull-up transistor in response to a bias input that is coupled to the gate of the first pull-up transistor by a first resistor and the gate of the second pull-up transistor by a second resistor, whereby the first output and the second output of the fully-differential amplifier stage operates with class A bias at DC and with class AB bias at high frequencies, and wherein a first time constant of the first resistor and the first capacitor and a second time constant of the second resistor and the second capacitor are equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator.

20. The method of claim 19, wherein the switched-power amplifier is an amplifier for providing a differential drive signal to an acoustic transducer having an acoustic transducer bandwidth above which the acoustic transducer has negligible response, and wherein the upper bound of the signal frequency range is an upper limit of the acoustic transfer bandwidth.

21. A fully-differential amplifier that implements an integrator for providing an output to a switched-power stage of a switched-power amplifier, the differential amplifier comprising:

a pair of fully-differential amplifier stages connected in a cascade, wherein a first one of the pair of fully-differential amplifier stages has a common-mode control input, and wherein a second one of the pair of fully-differential amplifier stages comprises a first pull-up transistor that couples a first output of the fully-differential amplifier to a positive supply voltage, a first pull-down transistor that couples the first output of the fully-differential amplifier to a negative supply voltage, a second pull-up transistor that couples a second output of the fully-differential amplifier to the positive supply voltage, a second pull-down transistor that couples the second output of the fully-differential amplifier to the negative supply voltage, a first capacitor that couples a gate of the first pull-down transistor and a gate of the first pull-up transistor, a second capacitor that couples a gate of the second pull-down transistor and a gate of the second pull-up transistor, and a bias input for controlling a direct-current (DC) bias voltage of the gate of the first pull-up transistor and the gate of the second pull-up transistor, whereby the first output and the second output of the fully-differential amplifier stage operates with class A bias at DC and with class AB bias at high frequencies, wherein the bias input is coupled to the gate of the first pull-up transistor by a first resistor and the gate of the second pull-up transistor by a second resistor, and wherein a first time constant of the first resistor and the first capacitor and a second time constant of the second resistor and the second capacitor are equal and provide a corner frequency at the gate of the first pull-down transistor and the gate of the second pull-down transistor that falls between a switching frequency of the switched-power stage and an upper bound of a signal frequency range reproduced by the switched-power amplifier in response to signals provided at an input of the integrator;

a low-frequency feedback control path coupled between an output of the fully-differential amplifier stages and the common-mode control input, wherein the low-frequency feedback path controls low-frequency drift of a common-mode voltage of the output of the fully-differential amplifier stages; and a high-frequency feed-forward control path coupled between a pair of inputs of the one or more fully-differential amplifier stages and the common-mode control input, wherein the high-frequency feed-forward control path controls high-frequency ripple of a common-mode voltage of a pair of inputs of the one or more fully-differential amplifier stages.

* * * * *

UNITED STATES PATENT AND TRADEMARK OFFICE
CERTIFICATE OF CORRECTION

PATENT NO. : 11,522,509 B2
APPLICATION NO. : 17/194395
DATED : December 6, 2022
INVENTOR(S) : Zhao et al.

It is certified that error appears in the above-identified patent and that said Letters Patent is hereby corrected as shown below:

On the Title Page

On Page 2, item (56), under "OTHER PUBLICATIONS", in Column 2, Line 2, delete "Jomades" and insert -- Jornades --, therefor.

In the Specification

In Column 4, Line 15, delete "encoder" and insert -- encoder and --, therefor.

In Column 4, Line 17, delete "$V_{IN}$" and insert -- $V_{IN\text{-}}$ --, therefor.

Signed and Sealed this
Twenty-first Day of February, 2023

Katherine Kelly Vidal
*Director of the United States Patent and Trademark Office*